(12) United States Patent
Wilson

(10) Patent No.: US 7,917,796 B2
(45) Date of Patent: Mar. 29, 2011

(54) METHOD AND APPARATUS FOR THE GENERATION AND CONTROL OF CLOCK SIGNALS

(75) Inventor: Thomas J. Wilson, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 483 days.

(21) Appl. No.: 12/069,266

(22) Filed: Feb. 8, 2008

(65) Prior Publication Data

US 2008/0215907 A1 Sep. 4, 2008

Related U.S. Application Data

(62) Division of application No. 10/753,032, filed on Jan. 6, 2004, now Pat. No. 7,434,083.

(51) Int. Cl.
*G06F 1/00* (2006.01)
*G06F 1/04* (2006.01)

(52) U.S. Cl. ......... 713/500; 713/600; 375/130; 375/376

(58) Field of Classification Search ............. 713/500, 713/600; 375/130, 376
See application file for complete search history.

(56) References Cited

U.S. PATENT DOCUMENTS

| | | | |
|---|---|---|---|
| 5,488,627 A | 1/1996 | Hardin et al. | |
| 6,294,936 B1 | 9/2001 | Clementi | |
| 6,366,174 B1 | 4/2002 | Berry et al. | |
| 6,404,294 B1 | 6/2002 | Sha et al. | |
| 6,553,057 B1 | 4/2003 | Sha et al. | |
| 6,650,193 B2 | 11/2003 | Endo et al. | |
| 6,658,043 B2 | 12/2003 | Hardin et al. | |
| 6,850,554 B1 | 2/2005 | Sha et al. | |
| 6,919,744 B2 | 7/2005 | Paist et al. | |
| 6,980,581 B1 | 12/2005 | Sha et al. | |
| 7,061,331 B2 | 6/2006 | Parikh | |
| 7,078,947 B2 * | 7/2006 | Loh | 327/156 |
| 7,305,060 B2 * | 12/2007 | Takeuchi | 375/376 |
| 2003/0058053 A1 | 3/2003 | Jeon et al. | |
| 2004/0114669 A1 * | 6/2004 | Takeuchi | 375/130 |
| 2004/0213324 A1 | 10/2004 | Hall et al. | |
| 2005/0077935 A1 | 4/2005 | Giuroiu | |

OTHER PUBLICATIONS

"Apple Unveils World's First 17-inch Notebook", Jan. 7, 2003.
Appel, Gary, "Fractional N synthesizers", RF signal processing, Nov. 2000, pp. 34-50.
Barrett, Curtis (ed.), "Fractional/Integer-N PLL Basics", Texas Instruments Technical Brief SWRA029, Aug. 1999, 55 pgs.
Cypress Press Release, "Cypress Announces Clock Support for Intel's Next-Generation Pentium® 4 Processor", Sep. 8, 2003.

* cited by examiner

*Primary Examiner* — Vincent T Tran
(74) *Attorney, Agent, or Firm* — Blakely, Sokoloff, Taylor & Zafman LLP

(57) ABSTRACT

Methods and apparatuses for the dynamic configuring of profiles used for the control of the frequency of clock signals. At least one embodiment of the present invention provides a means of dynamically generating, storing, updating and using spread spectrum profiles in a clock circuit to provide spread spectrum modulated clock signals and to slew clock frequency.

18 Claims, 9 Drawing Sheets

US 7,917,796 B2

METHOD AND APPARATUS FOR THE GENERATION AND CONTROL OF CLOCK SIGNALS

The present application is a divisional of U.S. application Ser. No. 10/753,032, filed Jan. 6, 2004 now U.S. Pat. No. 7,434,083.

FIELD OF THE TECHNOLOGY

The invention relates to digital circuits, and more particularly, to the generation of clock signals at different frequencies.

BACKGROUND

Clock signals are typically used for synchronization in data processing systems (e.g., handheld personal data assistants and computers, such as palm computers, desktop personal computers or notebook computers). One or more clock signals may be used for the synchronization of the operations in various components in a data processing system and for the synchronization of the operations in the digital circuits within the various components of the data processing system. For example, the central processing unit (CPU) of a computer may operate at one clock frequency; and, the random access memory (RAM) of the computer may operate at another clock frequency. Typically, different clock signals in a data processing system are derived from a single source. The relation between the different clock signals is typically fixed so that the operations in different components can be easily synchronized.

Clock signals at a fixed frequency generate and radiate electromagnetic interference (EMI) that has spectral components peaked at the harmonics of the fundamental frequency of the clock circuit. Government regulations (e.g., FCC regulations in the United States) specify the maximum allowable emissions for electronic products. Thus, data processing systems are designed to comply with these EMI regulations.

The EMI from the clock signals increases as the clock speed and power increases. To comply with the EMI regulations, EMI from the clock signals are reduced through a number of design considerations. For example, clock lines may be routed carefully to minimize loops and other potential radiating structures. Shielding may be used to contain the EMI from the clock lines. EMI reduction can also be achieved through slowly modulating the clock frequency so that the spectral components of the EMI from the clock signal are spread out in the emission spectrum. Thus, the spread spectrum modulated clock signal does not get concentrated at the harmonics of the fundamental frequency.

A spread spectrum clock is one in which the center frequency of the clock is modulated slowly (e.g., with one complete modulation cycle every 33 µs or so). Various time domain "profiles" of the frequency deviation can be used. Typically used profiles are sinusoidal, triangular, or piecewise polynomial. The degree of EMI reduction achieved through a spread spectrum modulation is typically a function of the specific profile used. For example, a triangular profile typically provides a greater degree of EMI attenuation than a sinusoidal profile.

SUMMARY OF THE DESCRIPTION

Methods and apparatuses for the dynamic configuring of profiles used for the control of the frequency of clock signals are described here. Some of the embodiments of the present invention are summarized in this section.

At least one embodiment of the present invention provides a means of dynamically generating, storing, updating and using spread spectrum profiles in a clock circuit to provide spread spectrum modulated clock signals and to slew clock frequency.

In one aspect of the present invention, a clock circuit for a data processing system includes: a phase locked loop (PLL) to generate a clock signal through phase locking to a reference signal; profile memory to store profile data comprising a plurality of entries, which is capable of being updated while the PLL is generating the clock signal; and, a profile state machine coupled to the profile memory and the PLL to read the profile data in sequence from the profile memory and to control the PLL to adjust the frequency of the clock signal according to the profile data. In one example of an embodiment, the number of entries of a profile read by the profile state machine in sequence to control the PLL is adjustable. In one example of an embodiment, the profile memory is implemented using static random access memory (SRAM). In one example of an embodiment, the profile state machine spread spectrum modulates the clock signal according to the plurality of entries. In one example of an embodiment, a position of the profile in the profile memory, read by the profile state machine in sequence to control the PLL, is adjustable. The address information specifying the number of entries of the profile and the position of the profile in the profile memory may be read from the profile memory or from registers. In one example of an embodiment, the profile memory is capable of storing a plurality of profiles; and, the profile state machine is capable of being instructed to use one of the plurality of profiles to control the PLL. In one example of an embodiment, the profile memory stores address information for accessing the plurality of profiles at predetermined locations. In one example of an embodiment, the plurality of profiles comprise one profile for slewing the clock signal from a first nominal clock frequency to a second nominal clock frequency. In one example of an embodiment, the clock signal is slewed from the first nominal clock frequency to the second nominal clock frequency in managing power consumption and/or thermal status of the data processing system. In one example of an embodiment, the clock signal is slewed from the first nominal clock frequency to the second nominal clock frequency in balancing power consumption and computational load of the data processing system.

In one aspect of the present invention, a clock circuit for a data processing system includes: a phase locked loop (PLL) to generate a clock signal through phase locking to a reference signal; profile memory to store profile data comprising a plurality of entries which is capable of being updated while the PLL generates the clock signal; and, a profile state machine coupled to the profile memory and the PLL to read the profile data in sequence from the profile memory and to control the PLL to adjust the frequency of the clock signal according to the profile data. In one example of an embodiment, the profile memory is capable of storing a plurality of profiles; and, the profile state machine is capable of being dynamically instructed to use one of the plurality of profiles to control the PLL. In one example of an embodiment, the profile memory includes static random access memory (SRAM). In one example of an embodiment, the profile state machine spread spectrum modulates the clock signal according to the plurality of entries. The profile memory may store address information for accessing the plurality of profiles at predetermined locations. The profile state machine can be instructed to dynamically switch from one profile to another using the address information. In one example of an embodiment, the clock circuit is disposed on an integrated circuit (IC) chip. In one example of an embodiment, the clock circuit is capable of slewing the clock signal from a first nominal frequency to a second nominal frequency. The profile state machine may be dynamically instructed to use one of the plurality of profiles for one of the first and second nominal frequencies. In one example of an embodiment, the clock signal is slewed to manage power and thermal status of the data process system. In one example of an embodiment, the plurality of profiles stored simultaneously in the profile memory includes: a first profile for spread spectrum modulating the clock signal of a first nominal frequency; a second profile for spread spectrum modulating the clock signal of a second nominal frequency; and, a third profile for slewing the clock signal between the first and second nominal frequencies.

In one aspect of the present invention, a machine implemented method to control a frequency of a clock signal generated by a phase locked loop (PLL) includes: obtaining profile address information which specifies a location where a profile is stored in profile memory; and reading, from the profile memory according to the profile address information, profile data of the profile in sequence to control the PLL. The profile address information may further specify a size of the profile. In one example, the profile memory is implemented using static random access memory (SRAM). In one example, the clock signal is spread spectrum modulated according to the profile data; and, the address information is obtained from the profile memory. In one example, a portion of the profile memory is updated while the PLL generates the clock signal. In one example of an embodiment, the clock signal is slewed from a first nominal frequency to a second nominal frequency (e.g., to manage power consumption and computational performance, such as to increase the nominal frequency to increase the computational performance or to decrease the nominal frequency to decrease power consumption). The profile data of the profile is read in sequence to spread spectrum modulate the clock signal when the clock signal is in the second nominal frequency.

In one aspect of the present invention, a machine implemented method to control a frequency of a clock signal generated by a phase locked loop (PLL) includes: dynamically switching from using a first profile stored in profile memory to using a second profile stored in the profile memory for spread spectrum modulation of the clock signal. In one example of an embodiment, the method further includes: loading a plurality of profiles into the profile memory, which includes the first profile, the second profile and a third profile; spread spectrum modulating the clock signal at a first nominal frequency using the first profile; slewing the clock signal from the first nominal frequency to a second nominal frequency using the second profile; and, spread spectrum modulating the clock signal at the second nominal frequency using the third profile. In one example of an embodiment, a plurality of profiles (including the first and second profiles) are loaded into the profile memory (e.g., during an initialization period). In one example of an embodiment, the first profile is replaced with a third profile in the profile memory (e.g., when the second profile is used to modulate the clock signal). In one example of an embodiment, the size of the first profile is different from the size of the third profile. In one example of an embodiment, it is further switched from using the second profile to using the third profile stored in the profile memory for spread spectrum modulation of the clock signal. In one example of an embodiment, the clock frequency is slewed from a first nominal frequency to a second nominal frequency; and, the first profile is used for spread spectrum modulation of the clock signal when the clock signal has the first nominal frequency. In one example of an embodiment, the second profile is used for spread spectrum modulation of the clock signal when the clock signal has the second nominal frequency. In one example of an embodiment, the first nominal frequency is higher than the second nominal frequency; and, the clock frequency is slewed from the first nominal frequency to the second nominal frequency in response to a determination to reduce power consumption. The determination to reduce power consumption can be in response to a measurement of a thermal sensor. In another example of an embodiment, the first nominal frequency is lower than the second nominal frequency; and, the clock frequency is slewed from the first nominal frequency to the second nominal frequency in response to a determination to increase computational performance.

In one aspect of the present invention, a machine implemented method to control a frequency of a clock signal generated by a phase locked loop (PLL) includes: slewing the clock signal from a first nominal frequency to a second nominal frequency using first profile data stored in profile memory of a clock circuit, where the first nominal frequency is substantially different from the second nominal frequency. In one embodiment, the first profile data is used repeatedly to slew the clock signal from the first nominal frequency to the second nominal frequency. In one example, the clock signal is slewed from the first nominal frequency to the second nominal frequency in a substantially linear variation with respect to time. In one example, the PLL is an n-phase PLL; and each entry of the first profile data selects one of n phased outputs of the PLL. In one example, the profile memory further stores second profile data; and, the clock signal is spread spectrum modulated using the second profile data after the clock signal is slewed to the second nominal frequency. In one example, the clock signal is slewed in response to a determination to adjust one of: power consumption (e.g., to reduce the clock frequency to conserve power), thermal condition (e.g., to reduce the temperature in the computer), and computation performance (e.g., to increase the clock frequency to increase the computation performance).

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present disclosure are not necessarily references to the same embodiment; and, such references mean at least one.

Figure 1:
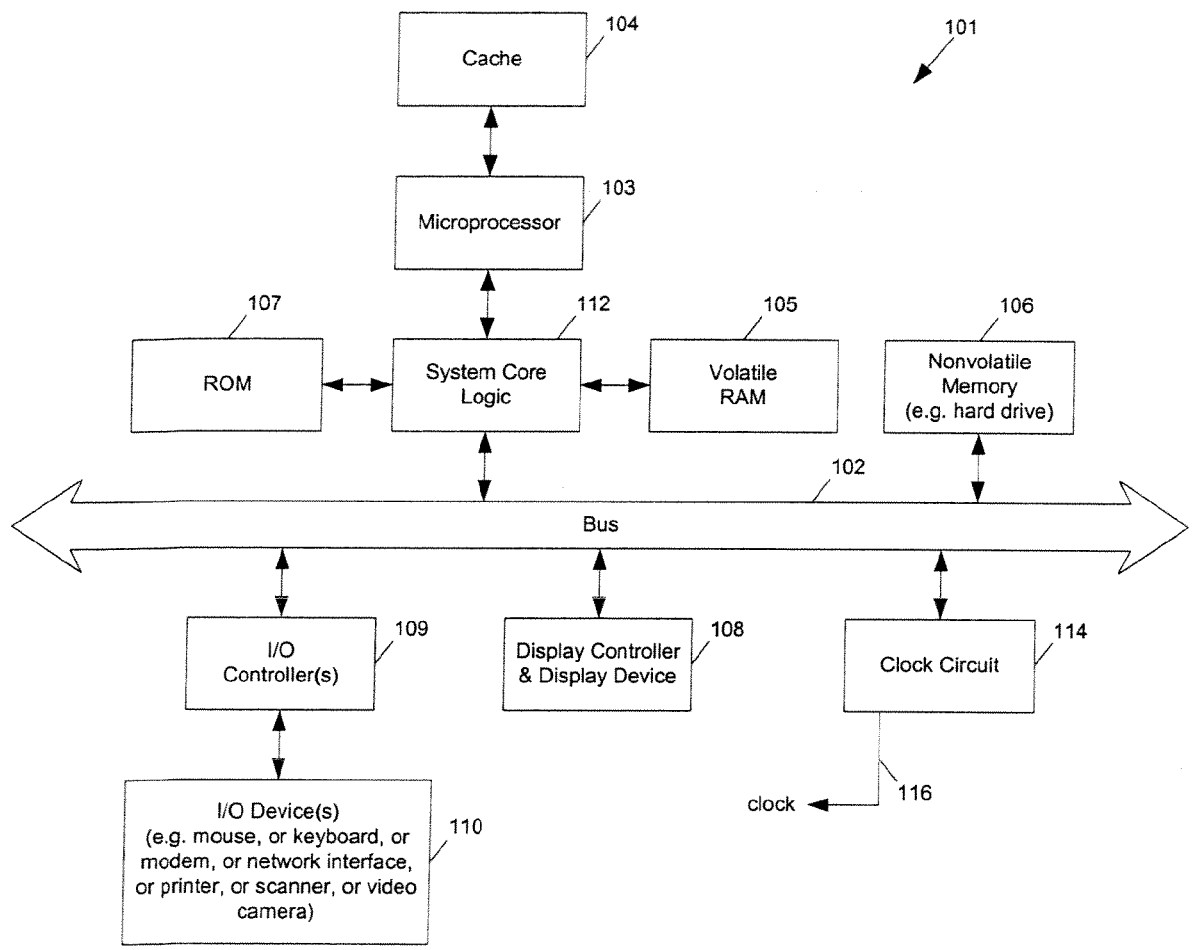
FIG. 1 shows a block diagram example of a data processing system which may be used with the present invention.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer or more components may also be used with the present invention. The computer system of FIG. 1 may, for example, be an Apple Macintosh computer.

As shown in FIG. 1, the computer system 101, which is a form of a data processing system, includes a bus 102 and system core logic 112 which interconnect a microprocessor 103, a ROM 107, and volatile RAM 105 and a non-volatile memory 106. The microprocessor 103, which may be, for example, a G3 or G4 or G5 microprocessor from Motorola, Inc. or IBM is coupled to cache memory 104 as shown in the example of FIG. 1. The bus 102 and system core logic 112 interconnect these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive, a magnetic optical drive, or an optical drive (e.g., a DVD RAM), or other type of memory system which maintains data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device that is coupled to the data processing system through a network interface such as a modem or Ethernet interface. The bus 102 may include one or more buses connected to one another through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

In one embodiment of the present invention, clock circuit 114, which generates clock signal 116 to synchronize the operations of various components of the system 101, such as processor 103, is programmable with an interface to bus 102. In one embodiment of the present invention, the clock circuit (114) contains at least one spread spectrum profile, which is dynamically programmable through bus 102, to spread spectrum modulate the clock signal (116). For example, after the system causes the clock circuit to slew one nominal clock frequency from another, the system can cause the clock circuit (114) to use a spread spectrum profile that is suitable for the current nominal clock frequency. For example, the system can update the profile in the clock circuit dynamically to change the spread spectrum modulation by the clock circuit.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM), random access memory (RAM), magnetic disk storage media, optical storage media, flash memory devices, etc.), as well as electrical, optical, acoustical or other forms of propagated signals (e.g., carrier waves, infrared signals, digital signals, etc.), etc.

Small variations in the system clock frequency can reduce the severity of radiated electromagnetic interference by "smearing" it over a wider range of frequencies, allowing the system to meet FCC emission requirements. At least one embodiment of the present invention provides a means of dynamically generating, storing, updating and using spread spectrum profiles in a clock circuit to provide spread spectrum modulated clock signals.

The specific spread spectrum profile to be used in a spread spectrum phase lock loop (PLL) has been typically determined during the design phase of the spread spectrum PLL.

The profile is typically "hard coded" into the spread spectrum PLL by means of a ROM or logic based lookup table. When the spread spectrum PLL is used in a system, the profile that is "hard coded" on the spread spectrum PLL is used to generate the spread spectrum clock signal. When the design of the system is changed, the requirement of the spread spectrum modulation of the clock PLL also changes. Thus, a different spread spectrum PLL is designed and manufactured. Such an approach can result in large development costs and significant delay in the development of making and verifying the design changes.

The approach of a single, system specific, hard-coded profile in a spread spectrum PLL might be suitable for previous generations of data processing systems that operate at a specified frequency. Their operational frequency was limited (e.g., a system with a 1 GHz CPU operated at 1 GHz clock). However, when the system frequency can dynamically change in a wide range (e.g., in a system which is attempting to reduce power consumption to conserve energy or in a system which is attempting to reduce heat generated within the system by slowing the clock frequencies), a single spread spectrum profile may become less effective as the frequency changes. Therefore, the overall EMI reduction achieved through spread spectrum modulation using a single profile can be less than in data processing systems where the frequency of operation was static. The ability to dynamically change the profile to control EMI emission from the clock circuits enhances the operation of a system which is changing clock speeds in order to reduce power consumption or in order to control the heat generated within a system (e.g., to prevent overheating).

Further, the EMI reduction through spread spectrum modulation using a spread spectrum is most effective over a limited range of operation frequency. A spread spectrum PLL having statically implemented spread spectrum profiles has a limited range of systems on which it can be effectively applied. Thus, the use of any specific spread spectrum PLL may be limited to a few, or even just one specific system implementation. As the number of unique system platforms and tiers within those platforms increases, the probability of requiring several unique spread spectrum PLL designs also increases. Therefore, the utility of a specific spread spectrum PLL design diminishes, which then requires that several different spread spectrum PLL designs be used across the full spectrum of computer systems. When the static profile spread spectrum PLLs most suitable for newly planned systems are not available, new designs are developed specifically for the new system. This increases the overall cost of the spread spectrum PLL since its volume cannot be leveraged across as many products as desired.

At least one embodiment of the present invention seeks to dynamically change the spread spectrum profile used for the clock generation when needed. Therefore, a single spread spectrum PLL can have its spread spectrum profile dynamically optimized for the specific system platform in which it is used. When the operation frequency of the system changes, the spread spectrum profiles can also be changed dynamically to adapt to current operation frequency. For example, if the system reduces the clock speed (e.g., to prevent overheating or to otherwise control the thermal status of the system), the system can dynamically change the profile for a different spread spectrum modulation in order to achieve adequate EMI control. The system can then increase the clock speed (e.g., after the system has cooled down) and a new profile can be loaded. Developers may change the spread spectrum profile in design, test, and verify new profiles for system optimization. Further, the system may dynamically change the spread spectrum profiles to allow the configuration change according to user preferences. For example, a user may choose to use a spread spectrum profile requiring a fee to further reduce EMI. Alternatively, the user may choose to trade higher EMI for other performance gain, within the limit of government regulations.

Figure 2:
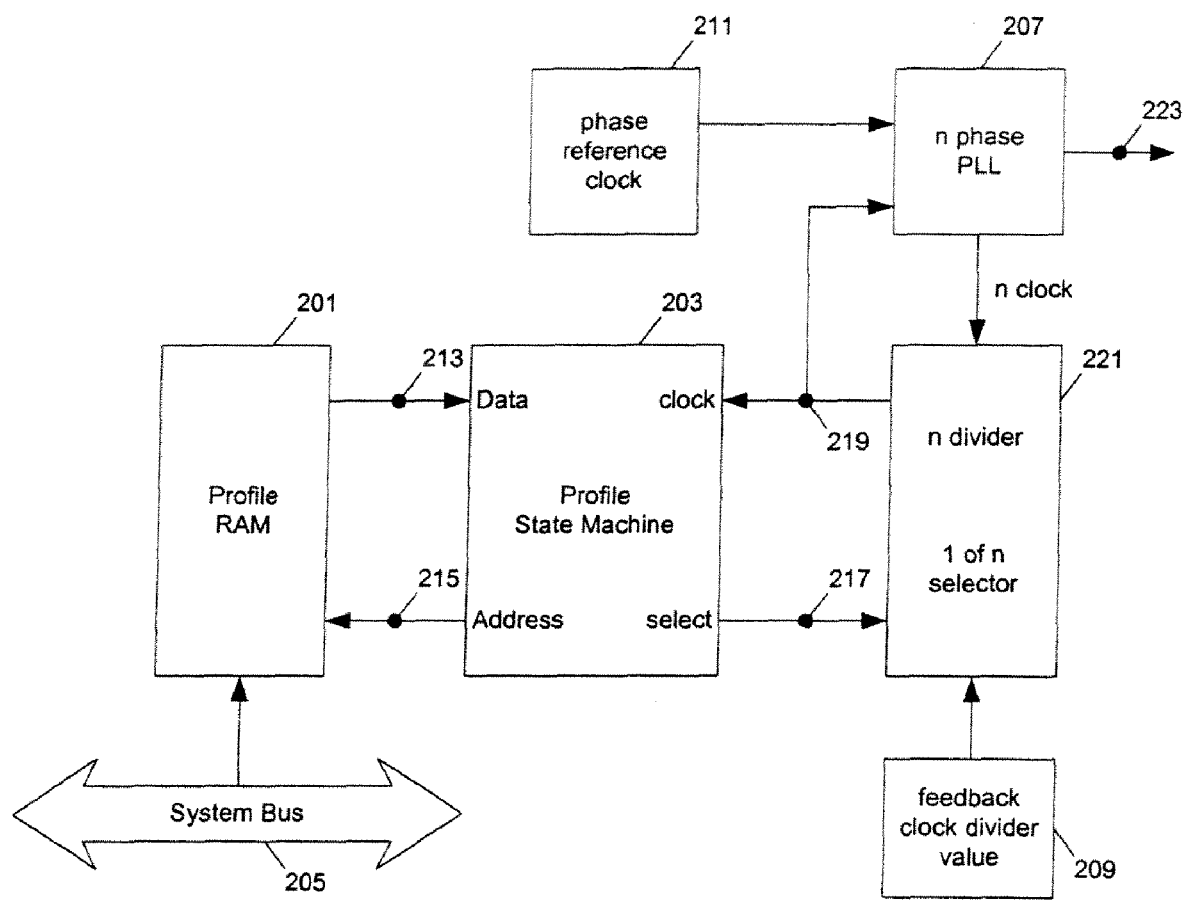
FIG. 2 shows a block diagram representation of a clock circuit according to one embodiment of the present invention.

FIG. 2 shows a block diagram representation of a clock circuit according to one embodiment of the present invention. At least one embodiment of the present invention implements a profile RAM (e.g., 201) in the spread spectrum PLL. In one embodiment of the present invention, profile RAM is implemented using SRAM (static RAM). The profile RAM can be dynamically loaded through a system interface (e.g., through $I^2C$ bus) with unique lookup parameters as may be required by any particular system implementation. Further, for example, as the operation frequency of the system changes, the spread spectrum profile can be modified by the system to more appropriately address the specific spread spectrum requirements as present in the new system operation frequency. Further, the size of the RAM can be such that multiple simultaneously stored spread spectrum profiles can be updated and selected for use as needed. Many elements of efficient and optimal EMI attenuating spread spectrum parameters can also be tailored specific to the system needs under the current operation condition. For example, spread spectrum modulation rate, as well as degree and direction (e.g., downspread or centerspread) of frequency modulation) can be dynamically changed.

The mechanism for providing a means of modulating the frequency over time varies from implementation to implementation. Various programmable digital PLL can be used with the present invention. One typical implementation utilizes a PLL structure in which the oscillator has multiple stages to produce multiple (e.g., "n") phases of clocks as its output (e.g., n phase PLL 207). One of the "n" phased clock outputs of the PLL 207 can be periodically selected as the feedback clock 219 that the PLL attempts to phase lock to its reference clock 211. Since each of these "n" phased clock output is 360/n degrees of phase from its neighbor, changing the clock used to phase compare against the reference clock causes the PLL to change the phase of the selected clock output to align itself with the reference frequency of oscillation. Thus, the PLL output frequency (223) will deviate from the value it had prior to the change in selection of the one of "n" phased clocks used as the clock to phase compare against the reference clock. When profile state machine 203 continuously cycles through a predetermined set of phased clock selections, according to the data in the profile RAM 201, a designed "profile" of frequency deviation can be achieved.

In one embodiment, profile state machine 203 is clocked with the feedback clock 219. Profile state machine 203 generates address 215 to read the profile data 213, according to which profile state machine provides a selection signal 217 to control the selection of the one of the "n" phased clock to modulate the clock frequency.

Feedback clock divider value 209 ("n") may be fixed or dynamically programmable. In one embodiment of the present invention, feedback clock divider value 209 ("n") is also stored in profile RAM 201 and retrieved by profile state machine 203 to control the n phase PLL (207).

In one embodiment of the present invention, before the content of profile RAM 201 is initialized, profile state machines uses default values to control the PLL 207. Once a profile is loaded into the profile RAM 201 from system bus 205, the profile state machine can be instructed to modulate the clock signal using the data in profile RAM 201.

In one embodiment of the present invention, profile RAM 201, profile state machine 203 and the PLL components (e.g., n phase PLL, n divider and one of n selector) are all implemented on one IC (Integrated Circuit) chip.

Figure 3:
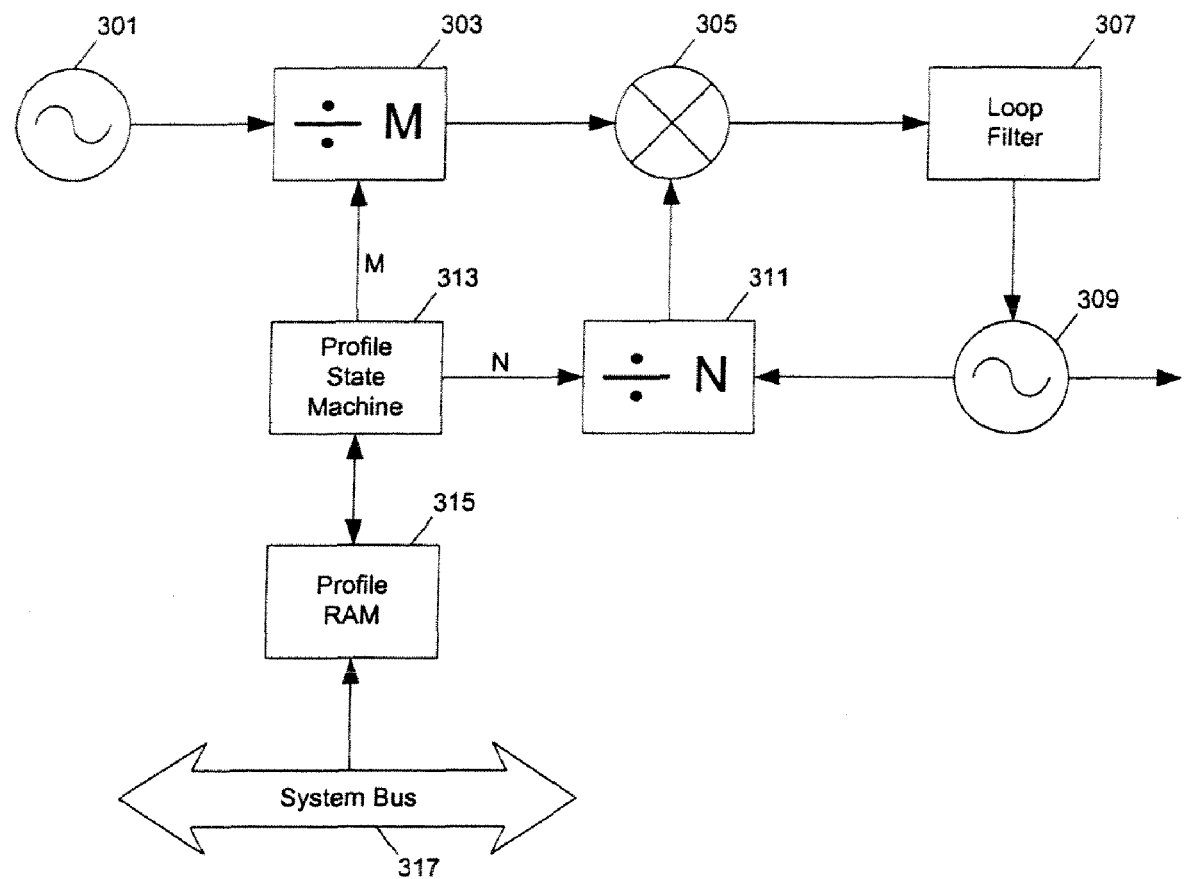
FIG. 3 shows a block diagram representation of another clock circuit according to one embodiment of the present invention.

FIG. 3 shows a block diagram representation of another clock circuit according to one embodiment of the present invention. In FIG. 3, oscillator 309 (e.g., voltage controlled oscillator (VCO)) generates the output clock signal $f_c$. Oscillator 301 (e.g., a temperature compensated crystal oscillators (TCXO)) provides a stable reference signal at frequency $f_r$. Phase detector 305 compares the reference signal divided by number M in frequency (303) and the output clock signal divided by number N in frequency (311). Phase detector 305 generates correction signal to control oscillator 309 so that $f_c/N = f_r/M$. Profile state machine 313 changes the parameters M and N according to the profile RAM 315 to change the output frequency $f_c$. In one embodiment of the present invention, both M and N are changed to control the clock frequency $f_c$. Alternatively, only N is changed to change the clock frequency $f_c$. In FIG. 3, components 303-311 can be those of a typical Integer-N PLL.

Figure 4:
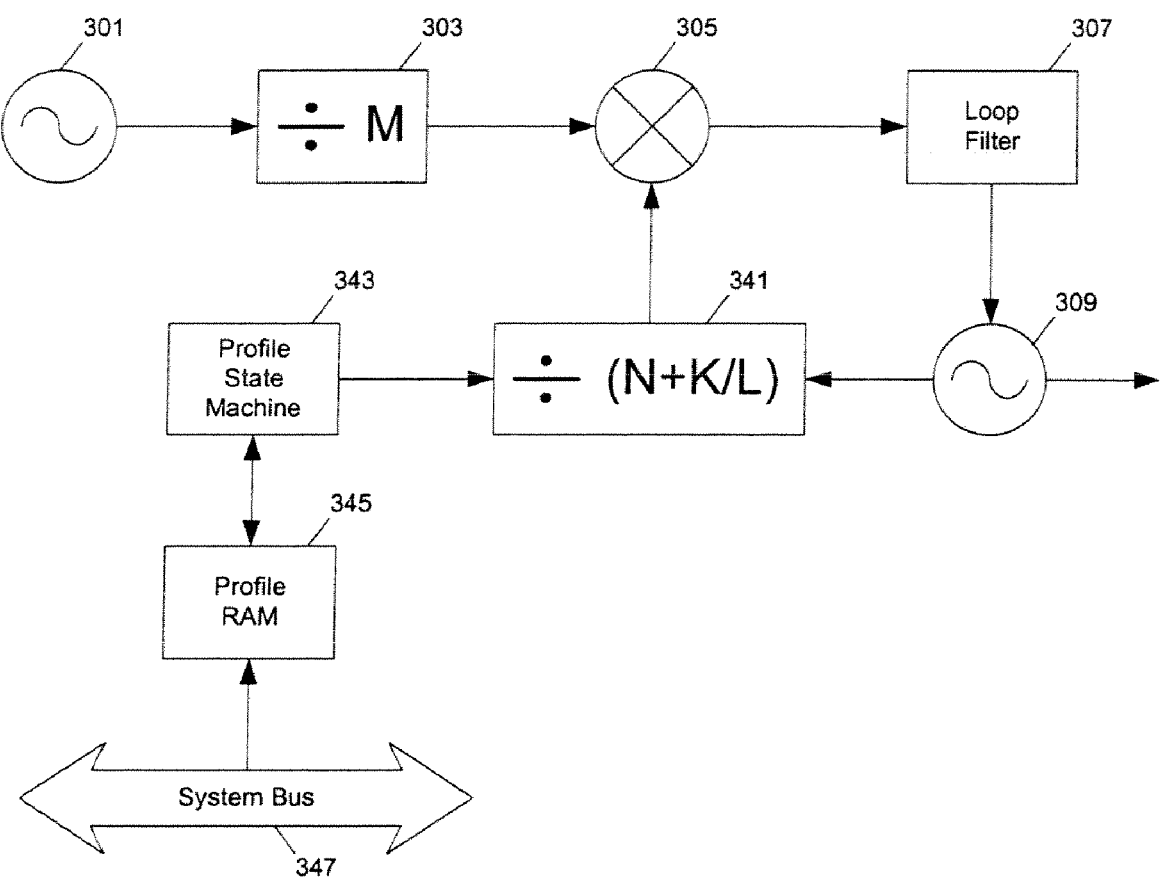
FIG. 4 shows a block diagram representation of another clock circuit according to one embodiment of the present invention.

FIG. 4 shows a block diagram representation of another clock circuit according to one embodiment of the present invention. In FIG. 4, oscillator 309 (e.g., voltage controlled oscillator (VCO)) generates the output clock signal $f_c$. Oscillator 301 (e.g., a temperature compensated crystal oscillators (TCXO)) provides a stable reference signal at frequency $f_r$. Phase detector 305 compares the reference signal divided by number M in frequency (303) and the output clock signal divided by number (N+K/L) in frequency (341). Fractional divider 341 divides the output clock signal divided by number (N+K/L) through averaging. For example, the output clock signal of oscillator 309 is divided by (N+1), K times out of L cycles and by N, (L−K) times out of the L cycles to achieve the average division of (N+K/L). Phase detector 305 generates correction signal to control oscillator 309 so that $f_c/(N+K/L) = f_r/M$. Profile state machine 343 changes the parameters N, K and L according to the profile RAM 345 to change the output frequency $f_c$. Alternatively, the profile state machine may further change the parameter M, in addition to N, K and L, to adjust the output clock signal $f_c$. In FIG. 4, components 303-309 and 341 can be those of a typical Fractional-N PLL.

Figure 5:
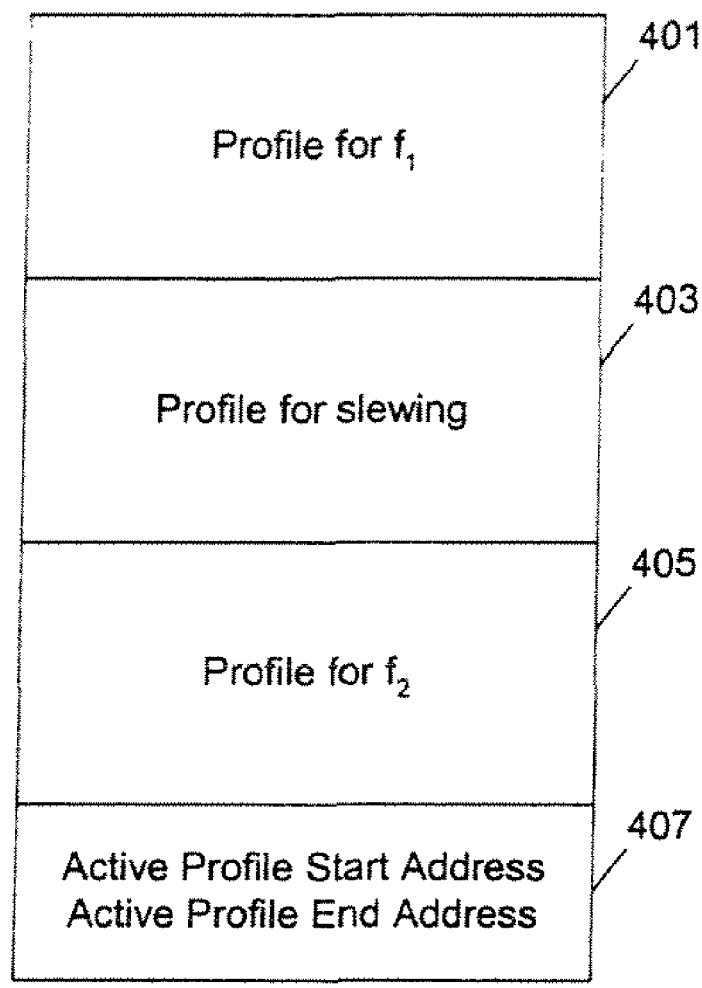
FIG. 5 shows an arrangement of a profile RAM according to one embodiment of the present invention.

FIG. 5 shows an arrangement of a profile RAM according to one embodiment of the present invention. In one embodiment of the present invention, a profile RAM includes a portion to store the start and end addresses of the active profile (407). The start and end addresses of the active profile are stored in the pre-determined location in the profile RAM (e.g., the lowest portion of the profile RAM). The start and end addresses point to the starting point and the ending point in the profile RAM where the active profile is stored. According to the start and end address, the profile state machine can access the profile data one entry after another in sequence. Alternatively, the active profile can be specified in terms of the starting address and the number of the profile entries of the active profile. Thus, the profile length can be changed dynamically. In one embodiment of the present invention, a plurality of profiles (e.g., 401, 403 and 405) are stored in the profile RAM. The active profile to be used in modulating the clock signal can be specified through dynamically changing the address information (407). Alternatively, the address information for the active profile can be stored in one or more registers in the clock circuit or in additional RAM locations.

In one embodiment of the present invention, the profile RAM comprises dual-port memory. Thus, while one profile (e.g., profile 401) is being used for the spread spectrum modulation for the current system frequency, the profile RAM can be updated to have a profile (e.g., profile 405) loaded for a target system frequency. The system clock can then be slewed (changed slowly) from the current system frequency to the target frequency (e.g., reducing the system clock to reduce power consumption or increase the system clock to increase the performance of the system). Once the target clock frequency is reached, the address information can be updated to cause the system clock to be modulated according to the profile suitable for the target clock frequency).

In one embodiment of the present invention, a separate profile (e.g., 403) is also used while the system slews the clock from one frequency to another.

Figure 6:
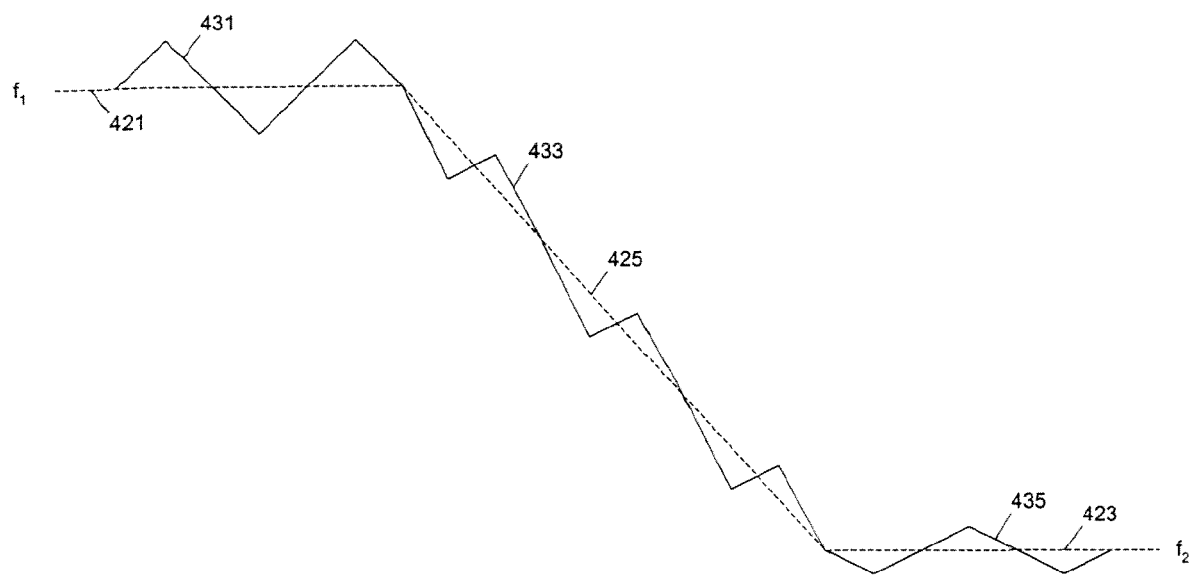
FIG. 6 shows an example scenario of adjusting clock frequency according to one embodiment of the present invention.

FIG. 6 shows an example scenario of adjusting clock frequency according to one embodiment of the present invention. In FIG. 6, the system clock is dynamically adjustable between frequency $f_1$, (421) and $f_2$ (423) without having to stop and restart the system. For example, when it is desirable to conserve power or to reduce power consumption to reduce heat generation (e.g., when one or more temperatures inside the computer detected by one or more temperature sensors are above a threshold), the system clock can be slewed from $f_1$, to $f_2$ (e.g., according to slop 425). Note that frequency $f_2$ may be dynamically determined to satisfy the need to reduce heat (or conserve power) without over degrading the performance of the system. For example, a power and heat management module may dynamically determine frequency $f_2$ based on the current computation load, available power and thermal status of the system to optimize the overall system performance. When the computation load, available power and thermal status of the system changes, the system may also increase the operation frequency. For example, when it is desirable to have improved computational power, the system clock can be slewed from $f_2$ back to $f_1$. In one embodiment of the present invention, the operation frequency can be changed dramatically to optimize the overall performance of the system, based the computation load, available power and thermal status of the system. For example, the CPU clock may be adjusted between 2 GHz and 1 GHz (or even lower) and these two clock frequencies may be considered to be substantially different. Note that typical spread spectrum modulation of a clock at a nominal frequency does not substantially change the clock frequency. Thus, a spread spectrum profile suitable for frequency $f_1$ may have a too high maximum frequency deviation. Similarly, a spread spectrum profile suitable for frequency $f_1$ may have a too low maximum frequency deviation to be effective. Thus, according to one embodiment of the present invention, the spread spectrum profile used for modulating the clock signal is dynamically changed as the operation frequency changes. When the nominal system clock is $f_1$, the clock signal is spread spectrum modulated using profile 431. When the system clock is slewed between $f_1$ and $f_2$, profile 433 is used. When the nominal system clock is $f_2$, the clock signal is spread spectrum modulated using profile 435. Spread spectrum profiles 432, 433 and 435 may have different maximum frequency deviations, different modulation period and different modulation rate, etc.

In one embodiment of the present invention, a profile is used to slowly change the clock frequency from one level to another. The change of the clock frequency with respect to time can be substantially linear (e.g., very close to line 425). The entire profile data for slewing can be used once to change the clock from nominal frequency $f_1$ to nominal frequency $f_2$. Further, the profile data can be used repeatedly to change the clock from nominal frequency $f_1$ to nominal frequency $f_2$. For example, when an n-phase PLL is used with a profile for slewing, the profile data can be chosen such that the clock frequency is reduced (or increased) by a certain percentage when the profile data is used once in a cycle. The profile of the phase selection is frequency independent. Thus, the profile data can be applied again to further reduce (or increase) the clock frequency. Slewing the clock from one nominal frequency to another can be achieved through repeatedly using the same profile data. In one embodiment of the present invention, the profile data is selected so that the clock is slewed substantially linearly with respect to time from one nominal frequency to another. For example, after spread spectrum modulating the clock using profile 431, the profile state machine can use a profile for slewing to slew the clock substantially along straight line 425, before spread spectrum modulating the clock using profile 435. Similarly, the profile for slewing the clock can also be used to change the clock slowly from nominal frequency $f_2$ to nominal frequency $f_1$ (e.g., from 435, 425 to 431).

In one embodiment of the present invention, the system clock can be slewed to one of a number of nominal frequencies. Before the system clock is slewed into the target nominal frequency, the spread spectrum suitable (or optimized) for the target nominal frequency is loaded into the profile RAM. After the system clock reaches the target nominal frequency, the clock circuit is instructed to use the corresponding profile to modulate the clock signal.

In one embodiment of the present invention, the profile RAM is loaded with a number of profiles. The corresponding address information of the profile RAM is stored in the predetermined location of the RAM profile. For example, the list of start addresses can be stored in the lowest portion of the profile RAM. When the profile state machine is instructed to use an active RAM, the corresponding address information can be retrieved to locate the active profile.

In one embodiment of the present invention, the address information for the active profile is stored in registers. After obtaining the address information from the registers, the profile state machine can then access the RAM to obtain the profile data and adjust the clock frequency according to the profile data.

In one embodiment of the present invention, the profile state machine schedules the read and write operations on the profile RAM. For example, when there is data pending for writing into RAM, the profile state machine may temporally suspends reading data from the profile RAM to allow the writing operation to finish before resuming reading operations to modulate the clock signal. During this period the profile state machine may use the previously retrieved profile entry to adjust the clock frequency or temporally stop modulating the clock signal. Alternatively, the profile RAM may schedule time sharing access to the profile RAM when there are pending data for writing into RAM. For example, the profile state machine may allow one write access after each read operation and skips one entry after each write access.

Figure 7:
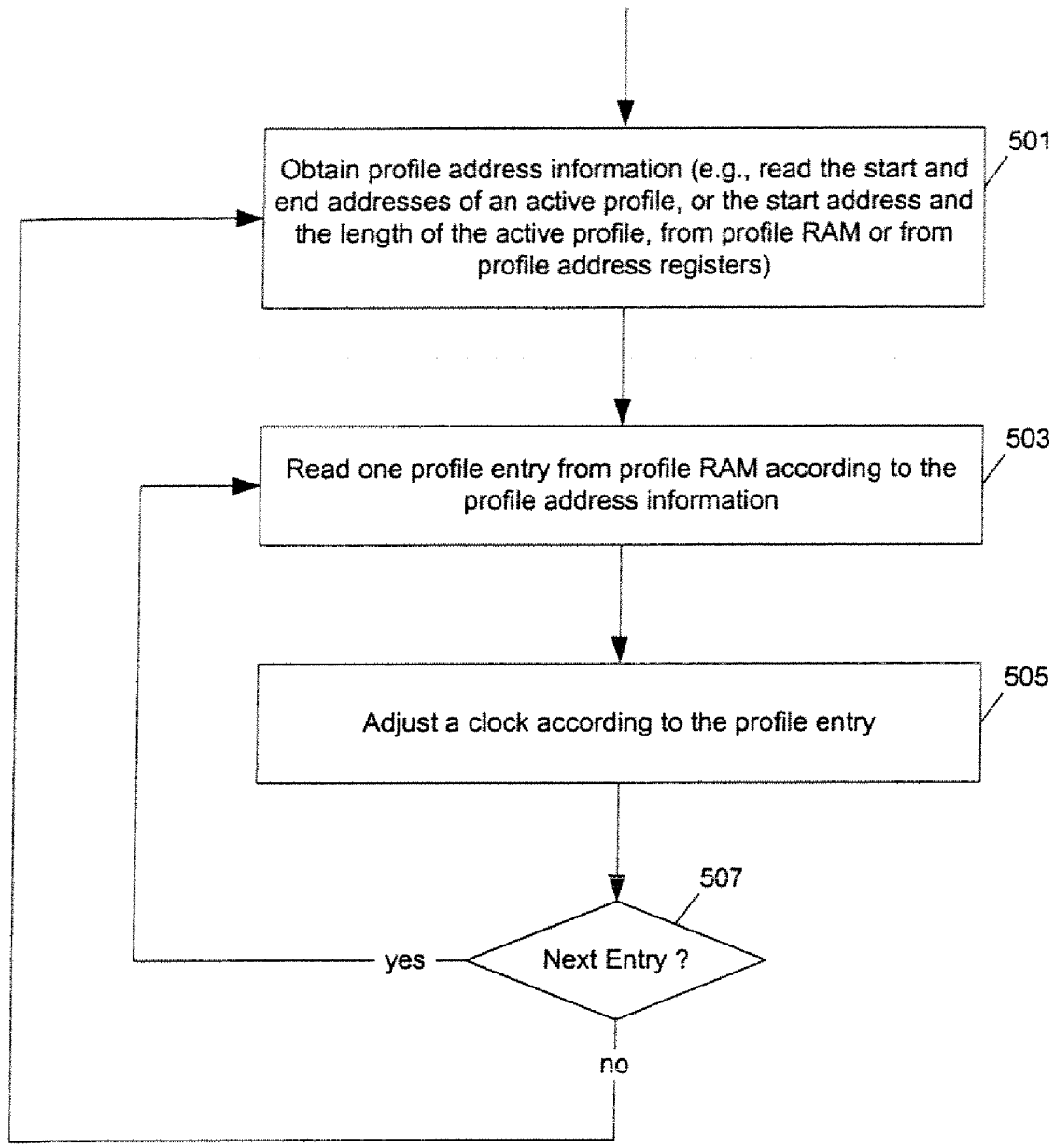
FIG. 7 shows a flow chart of a method to adjust clock frequency according to one embodiment of the present invention.

FIG. 7 shows a flow chart of a method to adjust clock frequency according to one embodiment of the present invention. After operation 501 obtains profile address information (e.g., read the start and end addresses of an active profile, or the start address and the length of the active profile, from profile RAM or from profile address registers), operation 503 reads one profile entry from profile RAM according to the profile address information. Operation 505 adjusts a clock according to the profile entry. If operation 507 determines to read the next entry of the profile, operations 503 and 505 are performed. Thus, the profile entries are read one at a time to adjust the clock signal. The entries of the profile are read at least one in a modulation cycle. Some spread spectrum profiles have built-in symmetry. For example, a triangle profile has symmetry so that data for a quart of the cycle stored in the profile RAM can be extended to be used for the entire cycle. After a complete cycle of the modulation, the address information may be read to obtain the address information for the profile for the next cycle. Alternatively, the system may force the profile state machine to read the address information instead of the next entry.

Figure 8:
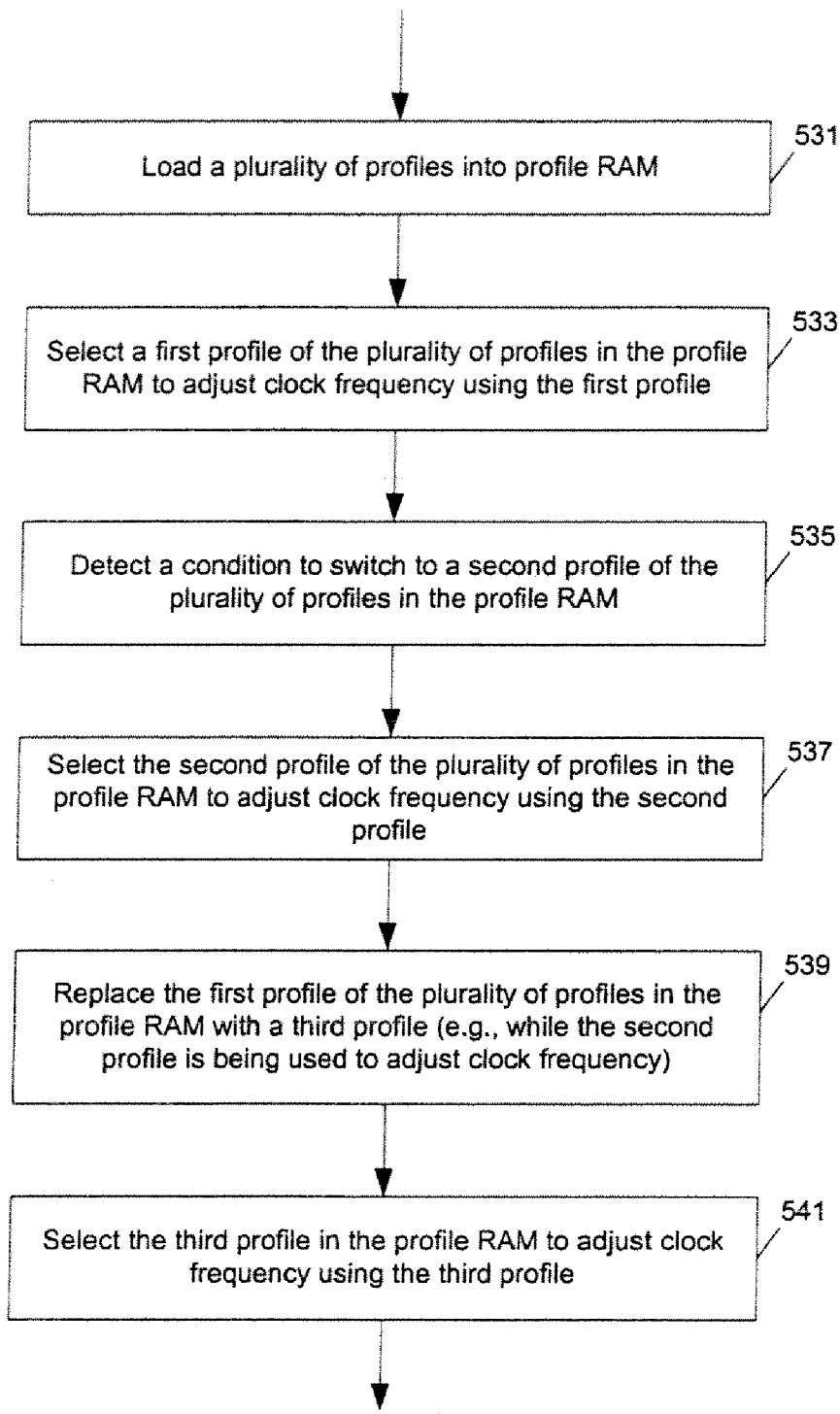
FIG. 8 shows a flow chart of a method to control a clock circuit according to one embodiment of the present invention.
Figure 9:
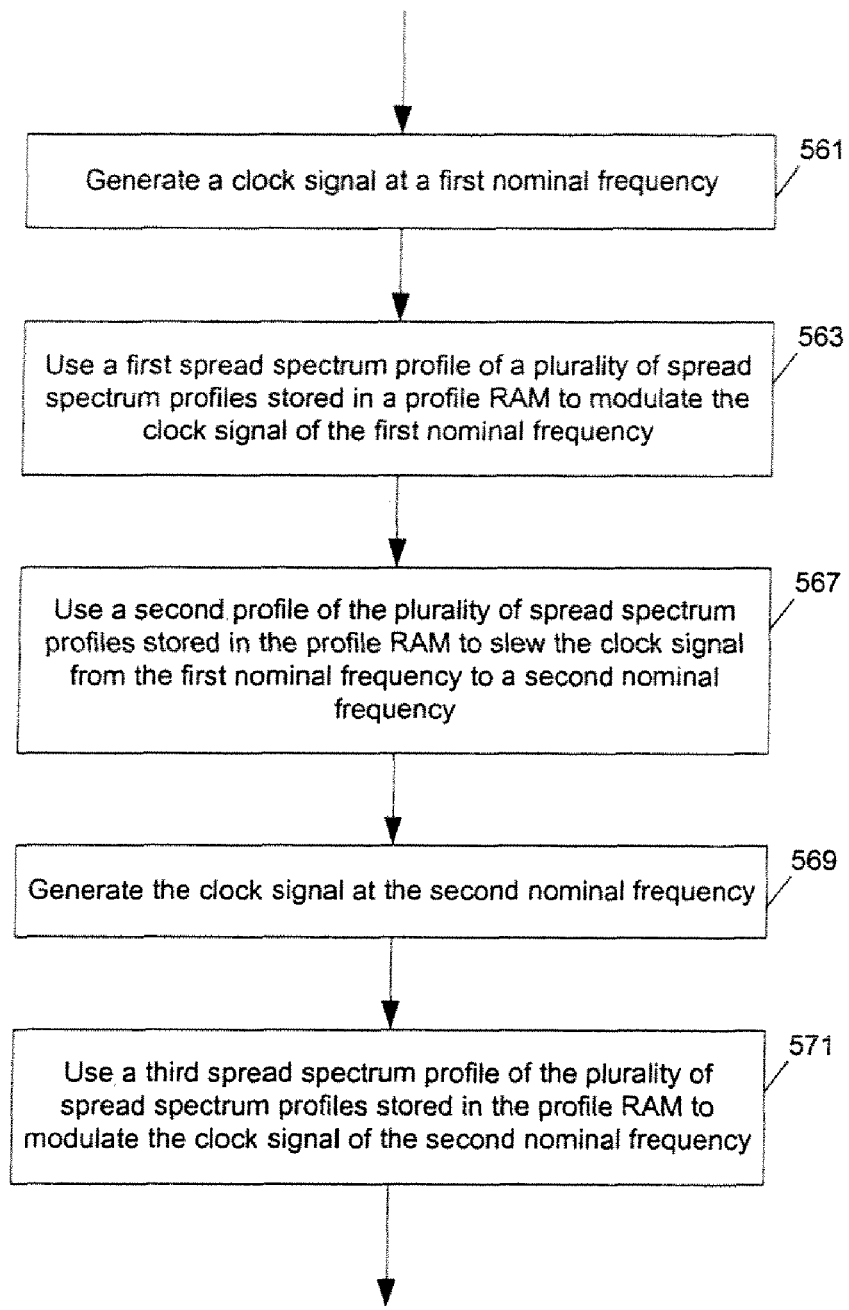
FIG. 9 shows an example of spread spectrum modulation of a clock slewed between two nominal frequencies according to one embodiment of the present invention.

FIG. 8 shows a flow chart of a method to control a clock circuit according to one embodiment of the present invention. After operation 531 loads a plurality of profiles into profile RAM, operation 533 selects a first profile of the plurality of profiles in the profile RAM to adjust clock frequency using the first profile. Operation 535 detects a condition to switch to a second profile of the plurality of profiles in the profile RAM (e.g., the system preparing to slew the system clock to a different frequency, the user instructing the system to use a different profile, the system clock reaching at a target frequency). Operation 537 selects the second profile of the plurality of profiles in the profile RAM to adjust clock frequency using the second profile. Operation 539 replaces the first profile of the plurality of profiles in the profile RAM with a third profile (e.g., while the second profile is being used to adjust clock frequency). The third profile may not have the same profile length as the first profile. Operation 541 selects the third profile in the profile RAM to adjust clock frequency using the third profile. For example, after the system clock is slewed from $f_1$ to $f_2$, the profile for $f_2$ is selected for spread spectrum modulation. To further slew the frequency from $f_2$ to $f_3$, the profile for $f_1$ is replaced with the profile for $f_3$ in the profile RAM. After the frequency of the system clock reaches $f_3$, the profile for $f_3$ is selected for spread spectrum modulation FIG. 9 shows an example of spread spectrum modulation of a clock slewed between two nominal frequencies according to one embodiment of the present invention. Operation 561 generates a clock signal at a first nominal frequency. Operation 563 uses a first spread spectrum profile of a plurality of spread spectrum profiles stored in a profile RAM to modulate the clock signal of the first nominal frequency. Operation 567 uses a second profile of the plurality of spread spectrum profiles stored in the profile RAM to slew the clock signal from the first nominal frequency to the second nominal frequency. In one embodiment of the present invention, an n-phase PLL is used to control the clock frequency (as illustrated in FIG. 2) where a set of profile values are used to control the selection of one of the n phased outputs. The set of profile values can be used repeatedly to slowly adjust the clock frequency so that the clock frequency is shifted from one level to another (e.g., substantially linearly with respect to time). After the clock signal reaches at the second nominal frequency in operation 569, operation 571 uses a third spread spectrum profile of the plurality of spread spectrum profiles stored in the profile RAM to modulate the clock signal of the second nominal frequency.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A machine implemented method to control a frequency of a clock signal generated by a phase locked loop (PLL), the method comprising:
   slewing the clock signal from a first nominal frequency to a second nominal frequency using first profile data stored in profile memory of a clock circuit, the first nominal frequency being substantially different from the second nominal frequency, wherein the cock signal has a slew spread spectrum profile during the slewing from the first nominal frequency to the second nominal frequency.

2. The method of claim 1, wherein the first profile data is used repeatedly during the time that the clock signal is slewing from the first nominal frequency to the second nominal frequency.

3. The method of claim 2, wherein the clock signal is slewed from the first nominal frequency to the second nominal frequency in a substantially linear variation with respect to time.

4. The method of claim 2, wherein the profile memory further stores second profile data; and, the method further comprises:
   spread spectrum modulating the clock signal using the second profile data after the clock signal is slewed to the second nominal frequency.

5. A clock circuit for a data processing system, the circuit comprising:
   a phase locked loop (PLL) to generate a clock signal;
   profile memory to store first profile data;
   a profile state machine coupled to the profile memory and the PLL, the profile state machine controlling the PLL to slew the clock signal from a first nominal frequency to a second nominal frequency using the first profile data stored in the profile memory, the first nominal frequency being substantially different from the second nominal frequency
   wherein the clock signal has a slew spread spectrum profile during slewing from the first nominal frequency to the second nominal frequency.

6. The circuit of claim 5, wherein the first profile data is used repeatedly during the time that the clock signal is slewing from the first nominal frequency to the second nominal frequency.

7. The circuit of claim 6, wherein the clock signal is slewed from the first nominal frequency to the second nominal frequency in a substantially linear variation with respect to time.

8. The circuit of claim 6, wherein the PLL is an n-phase PLL; and each entry of the first profile data selects one of n phased outputs of the PLL.

9. A machine non-transitory readable medium containing executable computer program instructions which when executed by a data processing system cause said system to perform a method to control a frequency of a clock signal generated by a phase locked loop (PLL), the method comprising:
   instructing a clock circuit to slew the clock signal from a first nominal frequency to a second nominal frequency using first profile data stored in profile memory of the clock circuit, the first nominal frequency being substantially different from the second nominal frequency,
   wherein the clock signal has a slew spread spectrum profile during the stewing from the first nominal frequency to the second nominal frequency.

10. The medium of claim 9, wherein the first profile data is used repeatedly during the time that the clock signal is slewing from the first nominal frequency to the second nominal frequency.

11. The medium of claim 10, wherein the clock signal is slewed from the first nominal frequency to the second nominal frequency in a substantially linear variation with respect to time.

12. The medium of claim 10, wherein the profile memory further stores second profile data; and, the method further comprises:
   instructing the clock circuit to spread spectrum modulate the clock signal using the second profile data after the clock signal is slewed to the second nominal frequency.

13. The medium of claim 9, wherein the clock signal is slewed in response to a determination to adjust one of:
   power consumption;
   thermal condition; and
   computation performance.

14. A data processing system, comprising:
   a clock circuit having profile memory storing first profile data;
   means for instructing a clock circuit to slew the clock signal from a first nominal frequency to a second nominal frequency using the first profile data stored in the profile memory of the clock circuit, the first nominal frequency being substantially different from the second nominal frequency,
   wherein the clock signal has a slew spread spectrum profile during the slewing from the first nominal frequency to the second nominal frequency.

15. The data processing system of claim 14, wherein the first profile data is used repeatedly during the time that the clock signal is slewing from the first nominal frequency to the second nominal frequency.

16. The data processing system of claim 15, wherein the clock signal is slewed from the first nominal frequency to the second nominal frequency in a substantially linear variation with respect to time.

17. The data processing system of claim 15, wherein the profile memory further stores second profile data and, the data processing system further comprises:
   means for instructing the clock circuit to spread spectrum modulate the clock signal using the second profile data after the clock signal is slewed to the second nominal frequency.

18. The data processing system of claim 14, wherein the clock signal is slewed in response to a determination to adjust one of:
   power consumption;
   thermal condition; and
   computation performance.

* * * * *

UNITED STATES PATENT AND TRADEMARK OFFICE
CERTIFICATE OF CORRECTION

| | | |
|---|---|---|
| PATENT NO. | : 7,917,796 B2 | Page 1 of 1 |
| APPLICATION NO. | : 12/069266 | |
| DATED | : March 29, 2011 | |
| INVENTOR(S) | : Thomas J. Wilson | |

It is certified that error appears in the above-identified patent and that said Letters Patent is hereby corrected as shown below:

In column 12, lines 30-31, after "modulation" insert -- . --.

In column 14, line 43, in Claim 17, delete "data" and insert -- data; --, therefor.

Signed and Sealed this
Twenty-ninth Day of November, 2011

David J. Kappos
*Director of the United States Patent and Trademark Office*